(12) United States Patent
Chuang

(10) Patent No.: US 8,786,365 B2
(45) Date of Patent: Jul. 22, 2014

(54) EXTERNAL PROGRAMMABLE DFE STRENGTH

(75) Inventor: Yu Meng Chuang, Taoyuan (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 81 days.

(21) Appl. No.: 13/602,816

(22) Filed: Sep. 4, 2012

(65) Prior Publication Data

US 2014/0062597 A1   Mar. 6, 2014

(51) Int. Cl.
   *H03F 3/45* (2006.01)
(52) U.S. Cl.
   CPC .................................. *H03F 3/45* (2013.01)
   USPC .................................. 330/254; 375/233
(58) Field of Classification Search
   CPC ........................................................ H03F 3/45
   USPC .......................... 330/254; 327/54, 57
   See application file for complete search history.

(56) References Cited

U.S. PATENT DOCUMENTS

2006/0291552 A1* 12/2006 Yeung et al. ................... 375/233

* cited by examiner

*Primary Examiner* — Robert Pascal
*Assistant Examiner* — Khiem Nguyen
(74) *Attorney, Agent, or Firm* — Juan Carlos A. Marquez; Morris, Manning & Martin, LLP

(57) ABSTRACT

A decision feedback equalizer is disclosed. The decision feedback equalizer comprises an amplifier circuit and a latch. The amplifier circuit is configured to receive an input signal, a decision feedback signal and a control signal, and is configured to adjust its driving capability according to the decision feedback signal and the control signal to provide an amplified signal of the input signal. The latch is configured to latch the amplified signal as an output signal.

16 Claims, 5 Drawing Sheets

PRIOR ART

EXTERNAL PROGRAMMABLE DFE STRENGTH

BACKGROUND OF THE INVENTION

1. Field of the Invention

The current disclosure relates to circuit design, and, in particular, to circuit design of a decision feedback equalizer.

2. Description of the Related Art

In high frequency application, for example, systems with Gigahertz frequency, the input buffer or the DIVW (Data-Input-Valid-Window) is not able to recognize the extremely small amplitude of the input data, since the o input data has extremely high frequency. The input data with extremely high frequency also has an extremely short period. Therefore, a high frequency system requires implementation of a decision feedback equalizer to enhance the capability of recognizing the amplitude of the input data.

FIG. 1 schematically illustrates a conventional decision feedback equalizer. As shown in FIG. 1, the decision feedback equalizer 100 comprises a plurality of amplifying latch modules 102. Each of the amplifying latch modules 102 comprises an amplifier 104 and a latch 106. The latch 106 is configured to latch an output signal of the amplifier circuit 104. An output signal of the latch 106 of the amplifying latch module 102 is an output signal of the decision feedback equalizer 100. The amplifier circuit 104 is configured to provide an amplifying signal of the input signal. Moreover, the amplifier circuit 104 also takes the output signal of a latch 106 in the previous stage as a feedback signal, and uses the output signal to adjust the driving capability. The output signal is also the feedback signal.

A voltage upper limit of an input signal going into the decision feedback equalizer 100 is a voltage upper limit of an external voltage. A voltage upper limit of the feedback signal is a voltage upper limit of an inner voltage of the decision feedback equalizer 100. However, the voltage of the input signal is higher or lower than the voltage of the feedback signal in different applications. If the voltage of the input signal is much higher than the voltage of the feedback signal, the feedback effect is not obvious. In contrast, if the voltage of the input signal is much lower than the voltage of the feedback signal, the output signal will be the feedback signal. This does not meet the requirements of current circuit design.

Thus, there is a need for a decision feedback equalizer having adjusted feedback capability to improve the shortcoming of the conventional design.

SUMMARY OF THE INVENTION

The object of the present invention is to provide a decision feedback equalizer having an amplifier circuit and a latch. The amplifier circuit is configured to receive an input signal, a decision feedback signal and a control signal. The amplifier circuit adjusts its driving capability according to the decision feedback signal and the control signal. The latch is configured to latch the amplifying signal as an output signal.

In accordance with one embodiment of the present invention, the decision feedback equalizer comprises a plurality of amplifying latch modules, configured to output a plurality of output signals according to an input signal, wherein the plurality of amplified latch modules comprise an amplifier circuit, configured to provide an amplifying signal of the input signal, and a latch configured to latch the amplifying signal as one of the plurality output signals, wherein the amplifier circuit configured to adjust its driving capability according to an output signal of another latch and a control signal.

In accordance with one embodiment of the present invention, the decision feedback equalizer comprises an amplifier circuit, configured to receive an input signal, a decision feedback signal and a control signal, and adjust its driving capability according to the decision feedback signal and control signal to provide an amplifying signal of the input signal, and a latch configured to latch the amplifying signal as an output signal.

In order to have further understanding of the techniques, means, and effects of the current disclosure, the following detailed description and drawings are hereby presented, such that the purposes, features and aspects of the current disclosure may be thoroughly and concretely appreciated; however, the drawings are provided solely for reference and illustration, without any intention to be used for limiting the current disclosure.

DETAILED DESCRIPTION OF THE INVENTION

Figure 2:
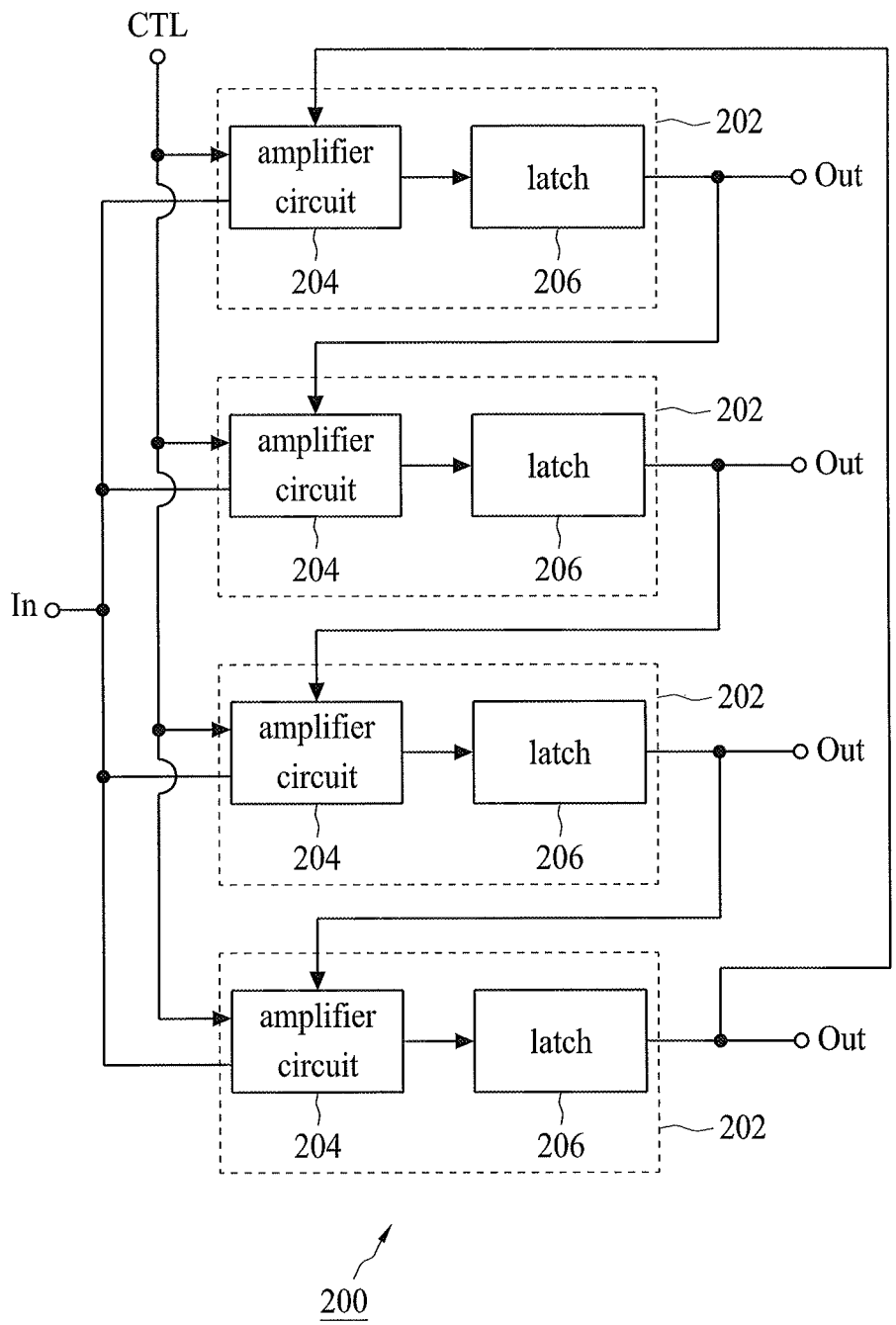
FIG. 2 schematically illustrates one embodiment of the present invention indicating a decision feedback equalizer.

The present invention is a decision feedback equalizer. FIG. 2 schematically illustrates one embodiment of the present invention indicating a decision feedback equalizer. As shown in FIG. 2, the decision feedback equalizer 200 comprises a plurality of amplifying latch modules 202. Each of the plurality of latch modules comprises an amplifier circuit 204 and a latch 206. The latch 206 is configured to latch an output signal of the amplifier circuit 204.

An output signal of the latch 206 of the plurality of amplifying latch modules 202 is an output signal of the decision feedback equalizer 200. The amplifier circuit 204 is configured to provide an amplifying signal of an input signal. Moreover, the amplifier circuit 204 also takes an output signal of a latch 206 in the previous stage as a feedback signal, and uses the output signal to adjust the driving capability. The output signal is also the feedback signal.

Figure 1:
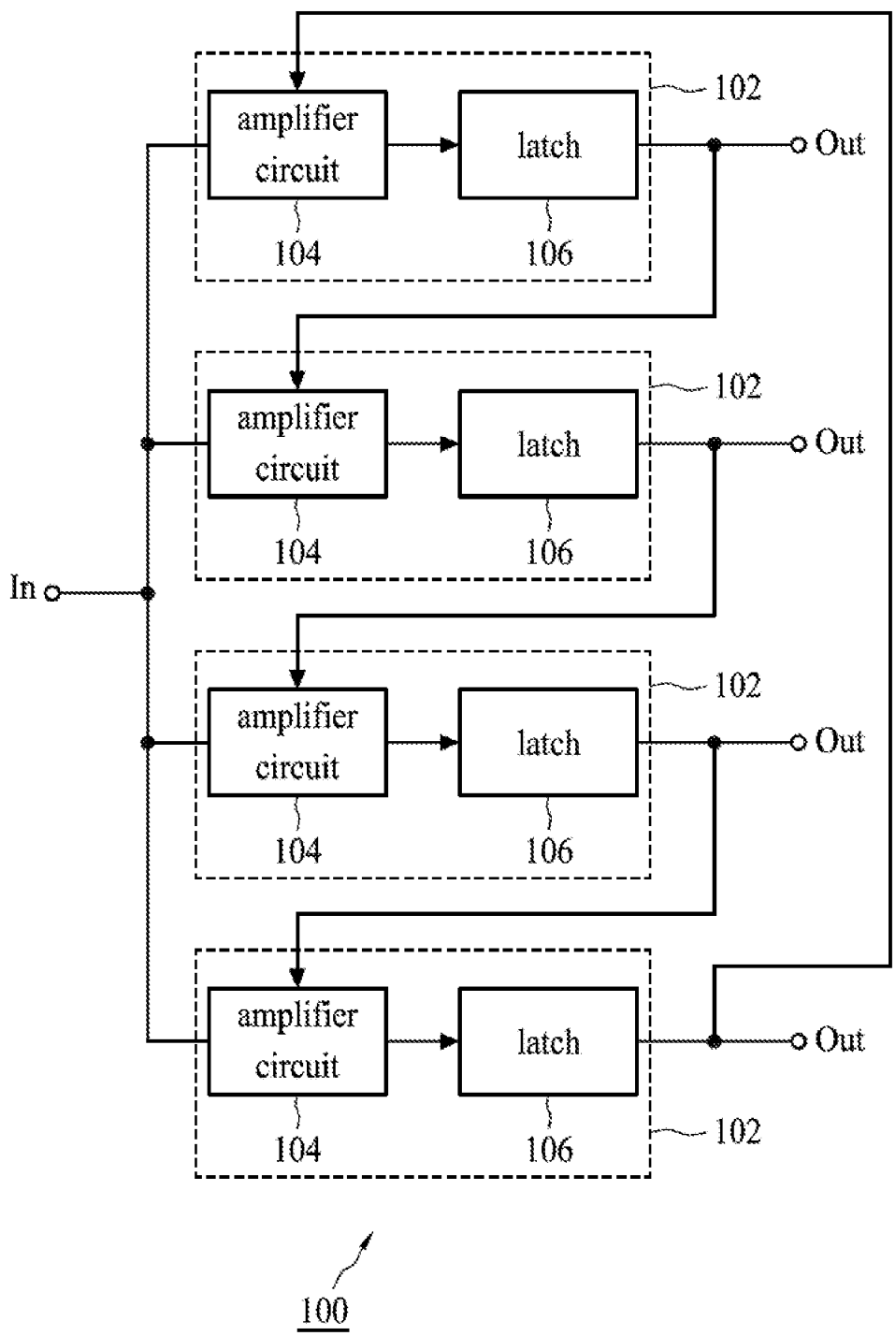
FIG. 1 schematically illustrates a conventional decision feedback equalizer.

Compared with the conventional decision feedback equalizer in FIG. 1, the amplifier circuit 204 adjusts its driving capability according to a control signal CTL. Thus, if a voltage of the input signal is smaller than a voltage of the output signal, the decision feedback equalizer 200 decreases feedback capability according to the control signal CTL. If a voltage of the input signal is larger than a voltage of the output signal, the decision feedback equalizer 200 increases feedback capability according to the control signal CTL. The output signal is also the feedback signal.

Figure 3:
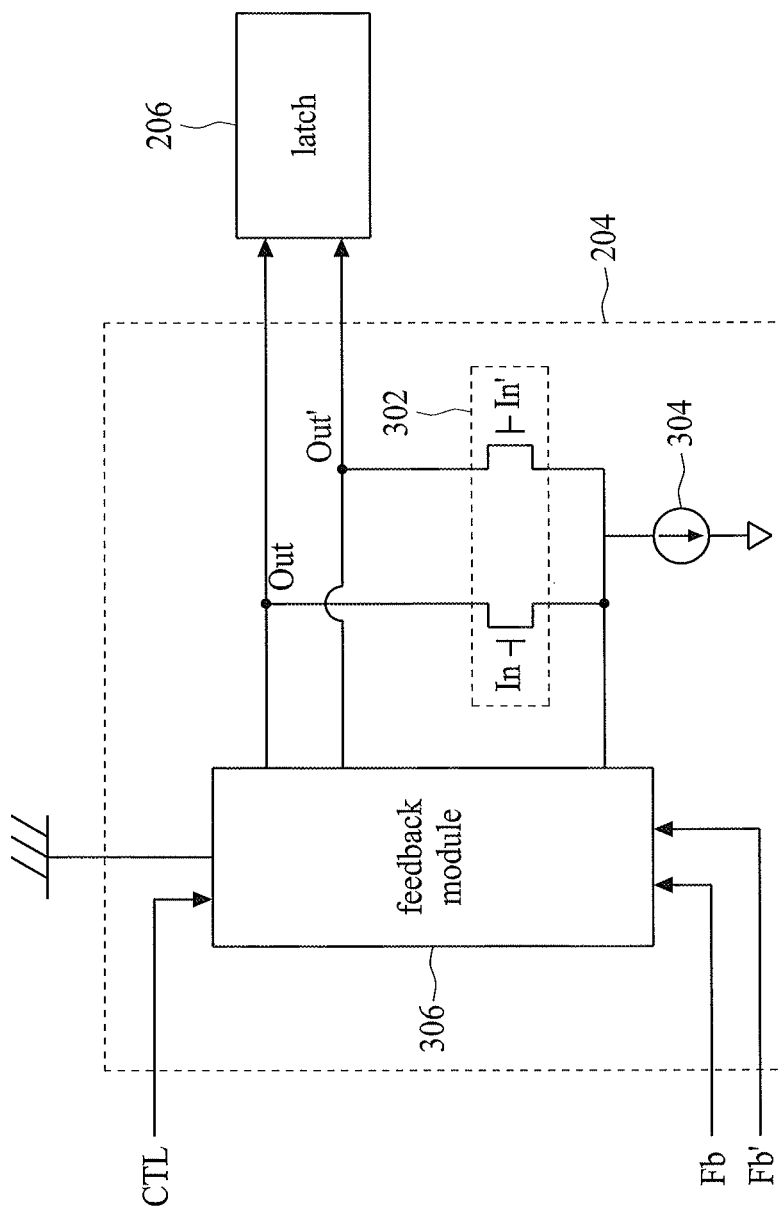
FIG. 3 schematically illustrates details of the amplifying latch module.

FIG. 3 schematically illustrates details of the amplifying latch module 202. As shown in FIG. 3, the amplifying latch module 202 comprises the amplifier circuit 204 and the latch 206. The amplifier circuit 204 is a differential amplifier circuit comprising a transistor pair 302, a current source 304 and a feedback module 306. The transistor pair is configured to provide an output signal Out of an input signal In and an output signal Out' of an inverse signal In'.

The current source 304 connecting to the transistor pair 302 and to ground is configured to be a current source of the amplifier circuit 204. The feedback module 306 connecting to the transistor pair 302 is configured to increase the driving capability of the amplifier circuit 204 according to an output signal of another amplifying latch module. The output signal is the feedback signal Fb or Fb'. More, the feedback module 306 adjusts its feedback capability according to a control signal CTL.

Figure 4:
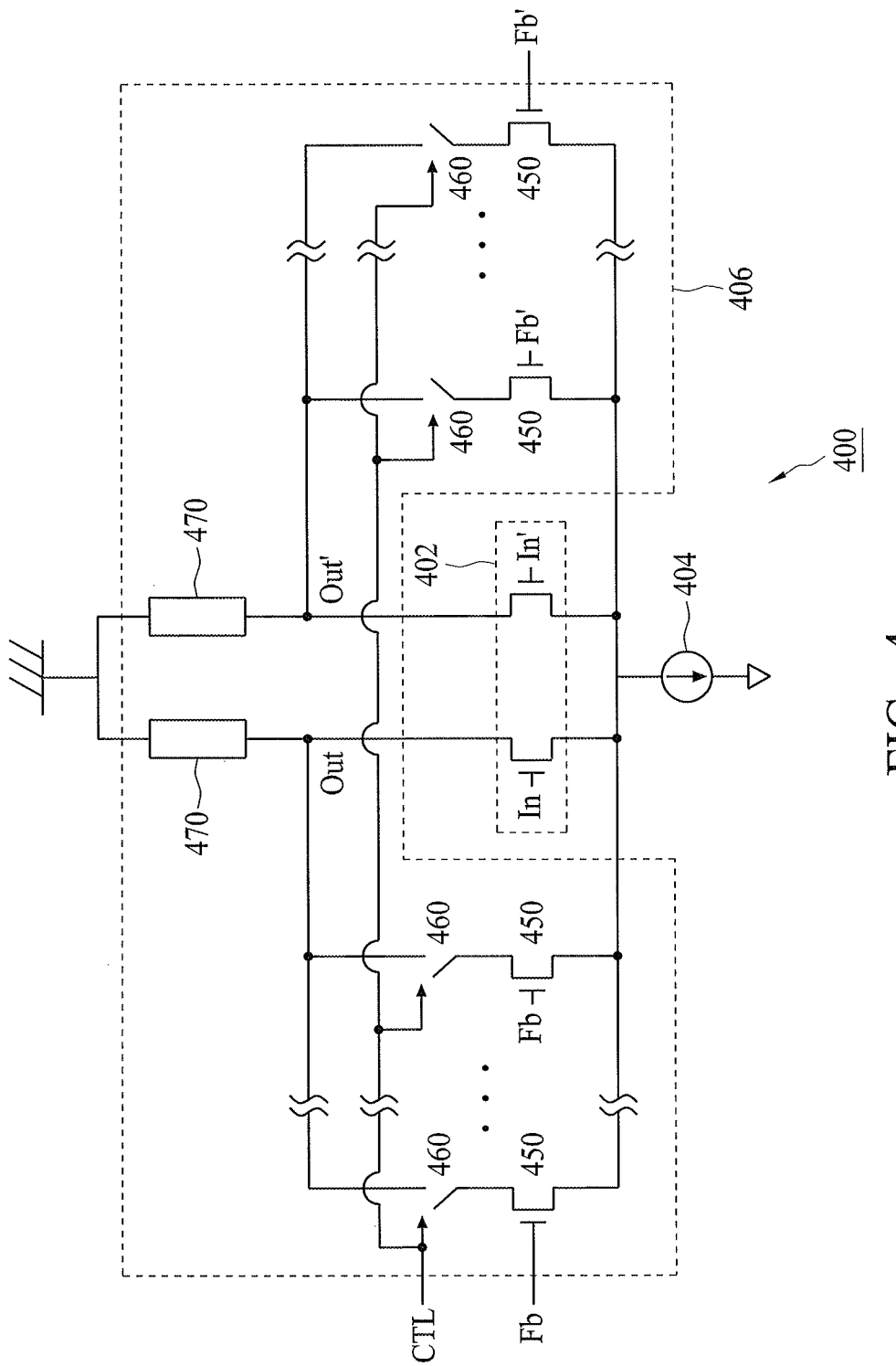
FIG. 4 schematically illustrates one embodiment of the present invention indicating details of an amplifier circuit.

FIG. 4 schematically illustrates one embodiment of the present invention indicating details of an amplifier circuit 400. As shown in FIG. 4, the amplifier circuit 400 comprises a transistor pair 402, a current source 404 and a feedback module 406. The feedback module 406 comprises a plurality of feedback transistor pairs 450, a plurality of switches 460 and a plurality of feedback load circuit 470. Each of the feedback plurality of transistor pairs 450 has an input terminal for receiving a feedback signal Fb or Fb'.

The plurality of switches is used for conducting an output terminal of the plurality of feedback transistor pairs 450 and an output terminal of the transistor pair 402. A control terminal of the plurality of switches is used for receiving the control signal CTL. The plurality of feedback load circuits 470 is configured to be loads of the feedback module 406. Therefore, the control signal is able to control the quantity of the plurality of feedback transistor pair 450 connecting to the transistor pair 402.

If the quantity of the plurality of feedback transistor pair 450 connecting to the transistor pair 402 increases, the current going through the current source 404 also increases. Meanwhile, the driving capability of the amplifier circuit 400 is increased. On the on the other hand, if the quantity of the plurality of feedback transistor pair 450 connecting to the transistor pair 402 decreases, the current going through the current source 404 also decreases. Meanwhile, the driving capability of the amplifier circuit 400 is decreased.

Figure 5:
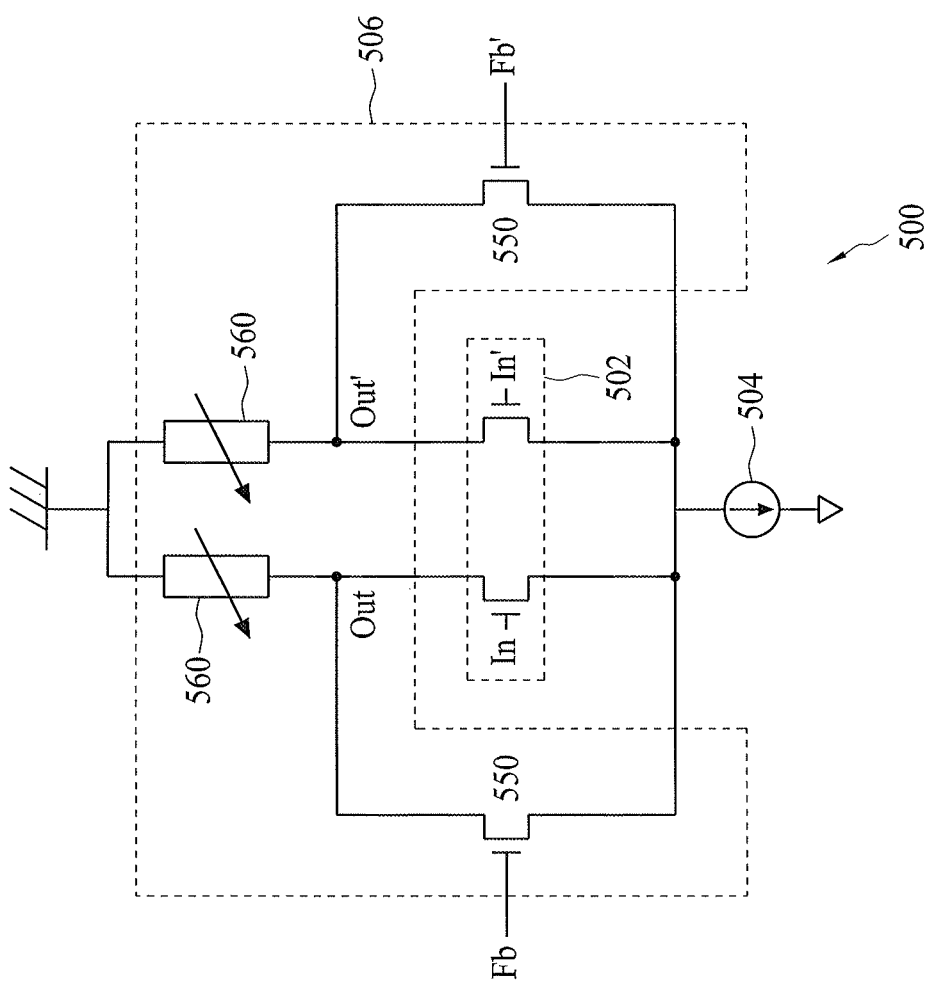
FIG. 5 schematically illustrates one embodiment of the present invention indicating details of an amplifier circuit.

FIG. 5 schematically illustrates one embodiment of the present invention indicating details of an amplifier circuit 500. As shown in FIG. 5, the amplifier circuit 500 comprises a transistor pair 502, a current source 504 and a feedback module 506. The feedback module 506 comprises a plurality of feedback transistor pairs 550 and a plurality of feedback load circuits 560. Each of the feedback plurality of transistor pairs 550 has an input terminal for receiving a feedback signal Fb or Fb' and has an output terminal connecting to an output terminal of the transistor pair 502.

The plurality of feedback load circuits 560 is configured to be loads of the feedback module 506. A value of the plurality of the feedback load circuits is increased or decreased according to the control signal CTL. Therefore, the current strength going through the plurality of feedback load circuits 560 can be increased or decreased by controlling the load value of the plurality of feedback load circuits 560 with the control signal CTL. The current strength going through the plurality of feedback load circuits 560 is also the current strength going through the current source.

If the load value of the plurality of the feedback load circuits 560 increases, the current going through the current source 504 also increases. Meanwhile, the driving capability of the amplifier circuit 500 is increased. On the other hand, if the load value of the plurality of the feedback load circuits 560 decreases, the current going through the current source 504 also decreases. Meanwhile, the driving capability of the amplifier circuit 500 is decreased.

In some of the embodiments of the present invention, the control signal CTL is provided by an external setting register such as an MRS (Mode Register Set).

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the to specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A decision feedback equalizer, comprising:
a plurality of amplifying latch modules, configured to output a plurality of output signals according to an input signal, wherein the plurality of amplified latch modules comprise:
an amplifier circuit, configured to provide an amplifying signal of the input signal; and
a latch, configured to latch the amplifying signal as one of the plurality output signals;
wherein the amplifier circuit is configured to adjust its driving capability according to an output signal of another latch and a control signal, and
the amplifier circuit is a differential amplifier circuit, comprising:
a transistor pair, configured to provide an amplifying signal of the input signal, and an amplifying signal of an inverse signal of the input signal,
a current source connecting to the transistor pair, configured to be a current source of the amplifier circuit, and
a feedback module connecting to the transistor pair and configured to increase driving capability of the amplifier circuit according to an output signal of another amplifying latch module.

2. The decision feedback equalizer of claim 1, wherein the feedback module comprises at least one feedback transistor pair having an input terminal for receiving the output signal of the another amplifying latch module and having an output terminal connecting to an output terminal of the feedback transistor pair.

3. The decision feedback equalizer of claim 2, wherein the feedback module establishes or breaks a connection between the at least one feedback transistor pair and the transistor pair by the control signal.

4. The decision feedback equalizer of claim 1, wherein the feedback module further comprises a feedback load circuit, and the load circuit is to increase or decrease its load value according to the control signal.

5. The decision feedback equalizer of claim 1, wherein if a voltage of the input signal is smaller than a voltage of the output signal, the amplifier circuit decreases its driving capability according to the control signal.

6. The decision feedback equalizer of claim 1, wherein if a voltage of the input signal is larger than a voltage of the output signal, the amplifier circuit increases its driving capability according to the control signal.

7. The decision feedback equalizer of claim 1, wherein the control signal is provided by an external setting register.

8. The decision feedback equalizer of claim 1, wherein the driving capability of the amplifier circuit is the current strength going through the amplifier circuit.

9. A decision feedback equalizer, comprising:
   an amplifier circuit, configured to receive an input signal, a decision feedback signal and a control signal, and adjust its driving capability according to the decision feedback signal and control signal to provide an amplifying signal of the input signal; and
   a latch, configured to latch the amplifying signal as an output signal, wherein
   the amplifier circuit is a differential amplifier circuit comprising:
   a transistor pair, configured to provide an amplifying signal of the input signal, and an amplifying signal of an inverse signal of the input signal,
   a feedback load circuit connecting to the transistor pair, configured to be a load of the amplifier circuit,
   a current source connecting to the transistor pair, configured to be a current source of the amplifier circuit, and
   a feedback module connecting to the transistor pair, configured to increase the driving capability of the amplifier circuit according to an output signal of another latch module.

10. The decision feedback equalizer of claim 9, wherein the feedback module comprises at least one feedback transistor pair having an input terminal for receiving the output signal of the another amplifying latch module and having an output terminal connecting to an output terminal of the feedback transistor pair.

11. The decision feedback equalizer of claim 10, wherein the feedback module establishes or breaks a connection between the at least one feedback transistor pair and the transistor pair by the control signal.

12. The decision feedback equalizer of claim 9, wherein the feedback module further comprises a feedback load circuit, and the feedback load circuit is to increase or decrease its load value according to the control signal.

13. The decision feedback equalizer of claim 9, wherein if a voltage of the input signal is smaller than a voltage of the output signal, the amplifier circuit decreases its driving capability according to the control signal.

14. The decision feedback equalizer of claim 9, wherein if a voltage of the input signal is larger than a voltage of the output signal, the amplifier circuit increases its driving capability according to the control signal.

15. The decision feedback equalizer of claim 9, wherein the control signal is provided by an external setting register.

16. The decision feedback equalizer of claim 9, wherein the driving capability of the amplifier circuit is the current strength going through the amplifier circuit.

* * * * *